(12) United States Patent
Diem et al.

(10) Patent No.: US 8,816,279 B2
(45) Date of Patent: Aug. 26, 2014

(54) TUNABLE LASER-BASED INFRARED IMAGING SYSTEM AND METHOD OF USE THEREOF

(75) Inventors: Max Diem, Boston, MA (US); Charles A. Dimarzio, Cambridge, MA (US)

(73) Assignee: Northeastern University, Boston, MA (US)

(*) Notice: Subject to any disclaimer, the term of this patent is extended or adjusted under 35 U.S.C. 154(b) by 0 days.

(21) Appl. No.: 13/084,287

(22) Filed: Apr. 11, 2011

(65) Prior Publication Data
US 2011/0248166 A1    Oct. 13, 2011

Related U.S. Application Data

(60) Provisional application No. 61/322,642, filed on Apr. 9, 2010.

(51) Int. Cl.
*H01L 31/0232* (2014.01)

(52) U.S. Cl.
USPC ..................................................... 250/330

(58) Field of Classification Search
CPC ........... G01N 2021/3595; G01N 21/35; G02B 21/002; G02B 1/00
USPC ..................................................... 250/330
See application file for complete search history.

(56) References Cited

U.S. PATENT DOCUMENTS

| | | |
|---|---|---|
| 5,136,422 A | 8/1992 | Ukon |
| 6,069,690 A | 5/2000 | Xu et al. |
| 7,560,679 B1 | 7/2009 | Gutierrez |
| 7,915,575 B2 * | 3/2011 | Yokoi ............................ 250/226 |
| 2002/0034000 A1 * | 3/2002 | Hoult et al. .................... 359/350 |
| 2005/0231713 A1 * | 10/2005 | Owen et al. ................. 356/237.1 |
| 2006/0208193 A1 | 9/2006 | Bodkin |
| 2007/0078348 A1 | 4/2007 | Holman |
| 2008/0144921 A1 | 6/2008 | Lizotte et al. |
| 2008/0240535 A1 | 10/2008 | Frangioni et al. |
| 2008/0304047 A1 | 12/2008 | Lee et al. |

FOREIGN PATENT DOCUMENTS

EP    1184702 A1    3/2002
WO    WO 2008012527 A1 *  1/2008

OTHER PUBLICATIONS

International Search Report issued for PCT/US2011/031960, dated Jul. 20, 2011 (2 pages).

(Continued)

*Primary Examiner* — Marcus Taningco
(74) *Attorney, Agent, or Firm* — Wilmer Cutler Pickering Hale and Dorr LLP (57) ABSTRACT

Methods, devices, and systems for imaging tissue and other samples or samples using infrared (IR) transmissions from coherent transmission sources, such as a wide range, tunable, quantum cascade laser (QCL) designed for the rapid collection of infrared microscopic data for medical diagnostics across a wide range of discrete spectral increments. The infrared transmissions are transmitted through, reflected from, and/or transreflected through a sample, and then magnified and/or focused prior to being detected by a detector. After detection, the sample related image data is used to assess the sample. Such methods, devices, and systems may be used to detect abnormalities in tissue, for example, before such abnormalities can be diagnosed using art cytopathological methods. The methods, devices and systems may also optionally include a visible light detection subsystem and/or a motion control subsystem to assist in control and processing of imaging.

22 Claims, 6 Drawing Sheets
(3 of 6 Drawing Sheet(s) Filed in Color)

(56) References Cited

OTHER PUBLICATIONS

Miljkovic, M. et al., "Label-free imaging of human cells: algorithms for image reconstruction of Raman hyperspectral datasets," Analyst, vol. 135: 2002-2013 (2002).

Coates, J. "Next-Generation IR Microscopy: The Devil is in the Detail," Photonics. Generated from http://www.photonics.com/Article.aspx?AID=44683, Dated Oct. 1, 2010 (4 pages).

* cited by examiner

TUNABLE LASER-BASED INFRARED IMAGING SYSTEM AND METHOD OF USE THEREOF

This application claims priority to Applicant's co-pending U.S. Provisional Patent Application No. 61/322,642 titled "A TUNABLE LASER-BASED INFRARED IMAGING SYSTEM" filed Apr. 9, 2010, the entirety of which is hereby incorporated by reference herein.

FIELD OF THE INVENTION

Aspects of the present invention relate to the fields of analysis of imaging data and assessment of imaged samples, including tissue samples. More specifically, aspects of the present invention are directed to the spectral characterization of samples, including biological samples and other infrared reflective or absorptive samples imaged using a tunable laser.

BACKGROUND OF THE INVENTION

In the art, a number of diseases are diagnosed using classical cytopathology methods involving examination of nuclear and cellular morphology and staining patterns. Typically, such diagnosis occurs by the examination of up to 10,000 cells in a sample and the finding of about 10 to about 50 cells that are abnormal. This finding is based on subjective interpretation of visual microscopic inspection of the cells in the sample.

Figure 1A:
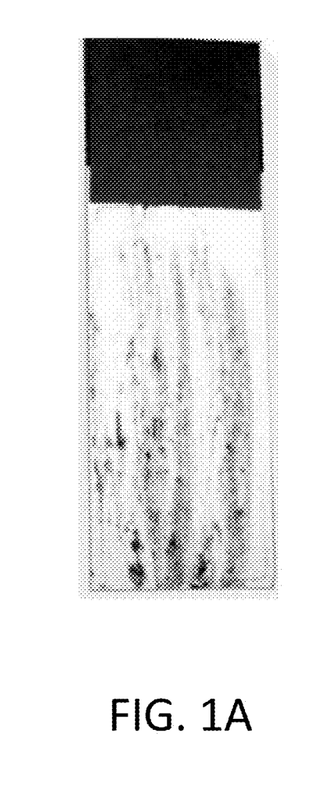
FIGS. 1A and 1B show Photostat images of an example Pap smear slide and a portion thereof under 10× microscopic magnification, respectively, in accordance with the art.
Figure 1B:
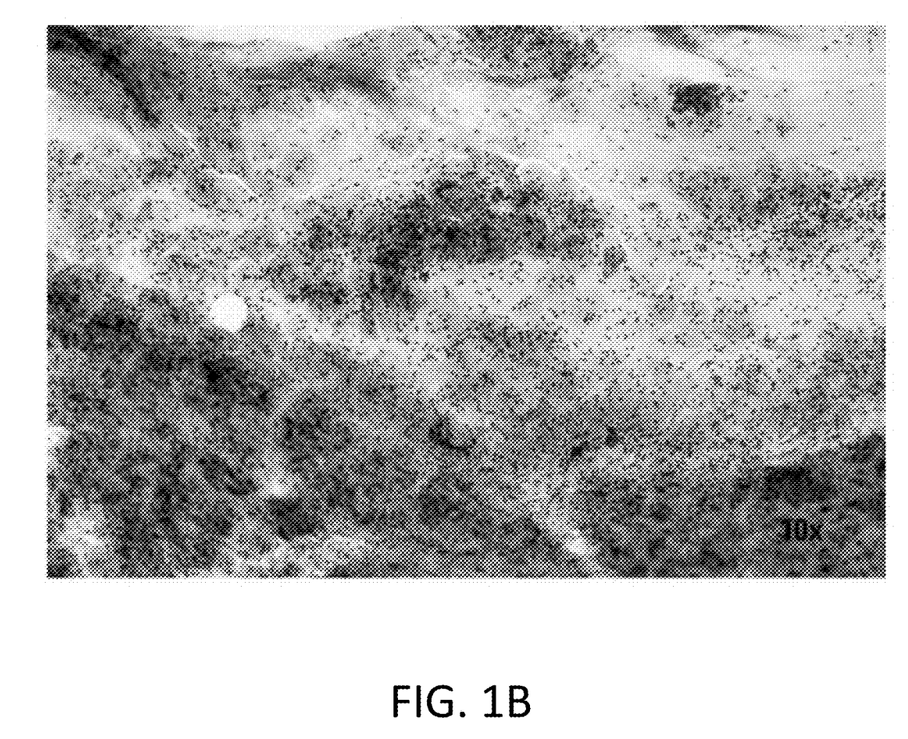

An example of such classical cytology dates back to the middle of the last century, when Papanicolaou introduced a method to monitor the onset of cervical disease by a test, commonly known as the "Pap" test. For this test, cells are exfoliated using a spatula or brush, and deposited on a microscope slide for examination. In the original implementation of the test, the exfoliation brush was smeared onto a microscope slide, hence the name "Pap smear." Subsequently, the cells were stained with hematoxylin/eosin (H&E) or a "Pap stain" (which consists of H&E and several other counterstains), and inspected visually by a cytologist or cyto-technician, using a low power microscope (see FIGS. 1A and 1B for Photostat images of an example Pap smear slide and a portion thereof under 10× microscopic magnification, respectively).

Figure 2:
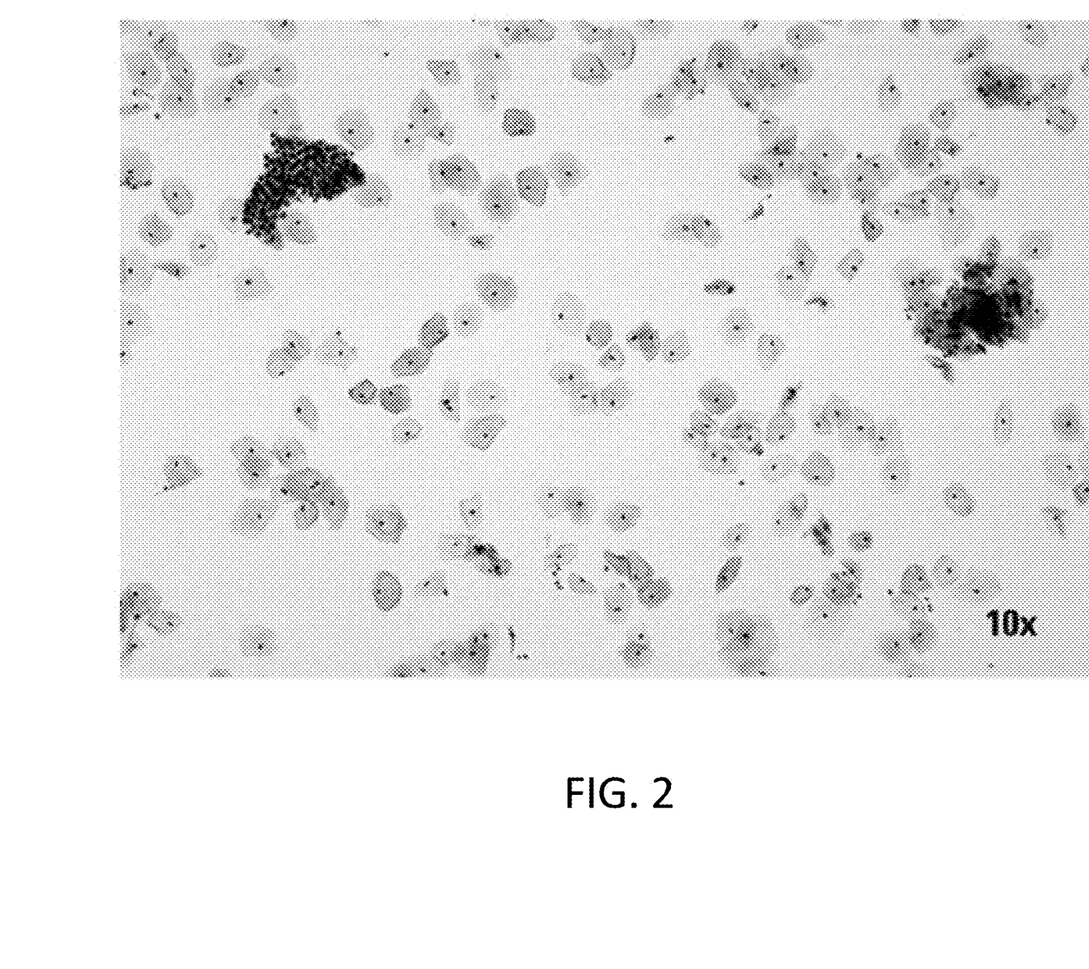
FIG. 2 shows an example Photostat image of a 10× magnification microscopic view of a cytologic sample prepared by liquid-based methods of the art.

The microscopic view of such samples often shows clumping of cells and contamination by cellular debris and blood-based cells (erythrocytes and leukocytes/lymphocytes). Accordingly, the original "Pap-test" had very high rates of false-positive and false-negative diagnoses. Modern, liquid-based methods (such as cyto-centrifugation, the ThinPrep® or the Surepath® methods) have provided improved cellular samples by eliminating cell clumping and removing confounding cell types (see, e.g., example Photostat image of a 10× magnification microscopic view of a cytologic sample prepared by liquid-based methods, shown in FIG. 2).

However, although methods for the preparation of samples of exfoliated cells on microscope slides have improved substantially, the diagnostic step of the art still typically relies on visual inspection and comparison of the results with a data base in the cytologist's memory. Thus, the diagnosis is still inherently subjective and associated with low inter- and intra-observer reproducibility. To alleviate this aspect, other art automated visual light image analysis systems have been introduced to aid cytologists in the visual inspection of cells. However, since the distinction of atypia and low grades of dysplasia is extremely difficult, such art automatic, image-based methods have not substantially reduced the actual burden of responsibility from the cytologist.

Spectral methods have also been applied in the art to the diagnosis of tissue sections available from biopsy. The data acquisition for this approach, referred to as "Spectral Histopathology (SHP)," can be carried out using the same visual light based instrumentation used for spectral cytopathology ("SCP").

Figure 3A:
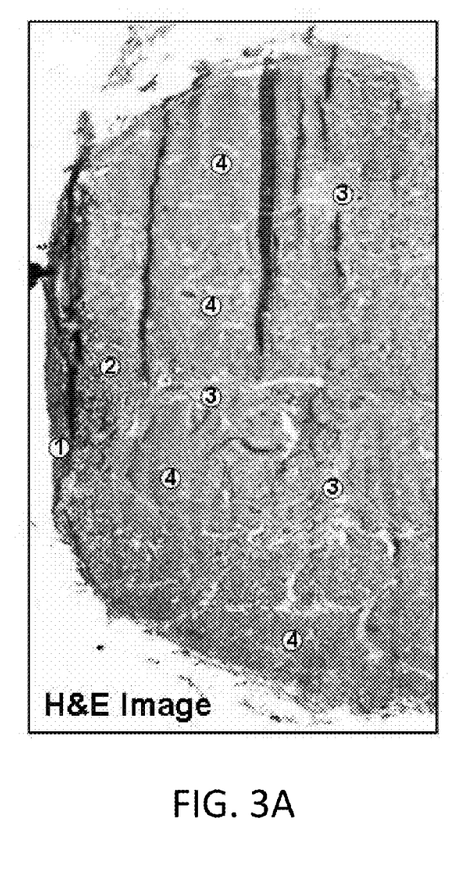
FIGS. 3A and 3B show Photostat images of the results of SHP for the detection of metastatic cancer in an excised axillary lymph node using methods of the art.
Figure 3B:
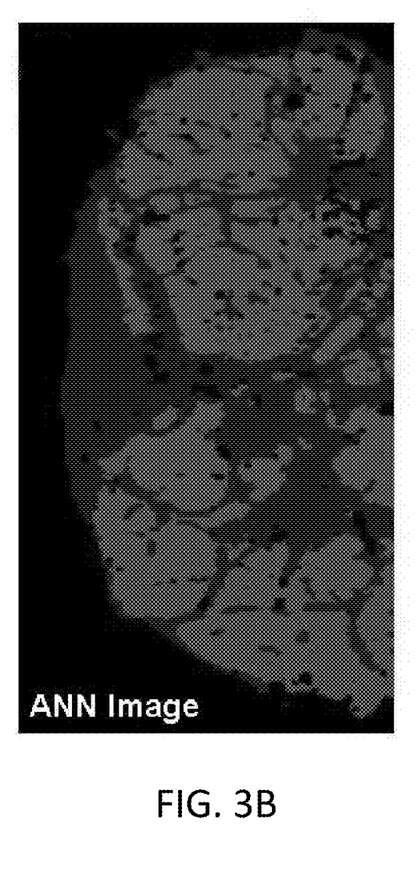

FIGS. 3A and 3B show Photostats of the results of SHP for the detection of metastatic cancer in an excised axillary lymph node using methods of the art. FIG. 3A shows a micrograph of the H&E stained image of axillary lymph node tissue, with regions marked as follows: 1) capsule; 2) normal lymph node tissue; 3) medullary sinus; and 4) breast cancer metastasis. To obtain the Photostat image shown in FIG. 3B, collected infrared spectral data were analyzed by a diagnostic algorithm, trained on data from several patients, which subsequently is able to differentiate normal and cancerous regions in the lymph node. In FIG. 3B, the Photostat shows the same tissue as in FIG. 3A constructed by supervised artificial neural network trained to differentiate normal and cancerous tissue only. The network was trained with data from 12 patients.

In some methods of the art, a broadband infrared (IR) or other light output is transmitted to a sample (e.g., a tissue sample), using instrumentation, such as an interferometer, to create an interference pattern. Reflected and/or passed transmission is then detected, typically as another interference pattern. A Fast Fourier Transform (FFT) may then be performed on the ratioed pattern to obtain spectral information relating to the sample.

One limitation with this FFT based art process is that the amount of energy available per unit time in each band pass may be very low, due to use of a broad spectrum transmission, which may include, for example, both IR and visible light. As a result, the data available for processing are generally inherently limited with this approach. Further, in order to discriminate the received data from background noise, for example, with such low detected energy data available, high sensitivity instruments must be used, such as high sensitivity liquid nitrogen cooled detectors (which cooling thereby alleviates the effects of background IR interference). Among other drawbacks, such art systems may incur great costs, and require the use of refrigerants.

In one art device produced by Block Engineering (see, e.g., J. Coates, "Next-Generation IR Microscopy: The Devil Is in the Detail," BioPhotonics (October 2010) pp. 24-27), which proposes to use a QCL without an interferometric imager, no device or system has been identified to suitably coordinate operation between the QCL and the imager.

There remains an unmet need in the art for devices, methods, and systems for transmitting and detecting IR and/or other similar transmissions for use, for example, for imaging tissue samples and other samples under ambient conditions for such purposes as the diagnosis of disease.

SUMMARY OF THE INVENTION

Aspects of the present invention include methods, devices, and systems for imaging tissue and other samples or samples using IR transmissions, reflections, and/or transflections from coherent transmission sources, such as a broad-band, tunable, quantum cascade laser (QCL) designed for the rapid collection of infrared microscopic data for medical diagnostics across a wide range of discrete spectral increments. The infrared transmissions, reflections, and/or transflections are transmitted through or reflected from a sample, and then magnified and/or focused prior to being detected by a detector. After detection, the sample related image data is used to assess the sample.

Such methods, devices, and systems may be used to detect abnormalities in tissue, for example, before such abnormalities can be diagnosed using known cytopathological methods.

The methods, devices, and systems may also optionally include a visible light detection subsystem and/or a motion control subsystem to assist in control and processing of imaging.

Additional advantages and novel features relating to variations of the present invention will be set forth in part in the description that follows, and in part will become more apparent to those skilled in the art upon examination of the following or upon learning by practice of aspects thereof.

BRIEF DESCRIPTION OF THE DRAWINGS

The patent or application file contains at least one drawing executed in color. Copies of this patent or patent application publication with color drawing(s) will be provided by the Office upon request and payment of the necessary fee. Aspects of the present invention will become fully understood from the detailed description given herein below and the accompanying drawings, which are given by way of illustration and example only, and thus not limited with respect to aspects thereof, wherein.

DETAILED DESCRIPTION

This application is also related to Applicant's co-pending U.S. patent application Ser. No. 12/994,647 filed titled "METHOD OF RECONSTITUTING CELLULAR SPECTRA USEFUL FOR DETECTING CELLULAR DISORDERS" filed Nov. 24, 2010, based on Patent Cooperation Treaty (PCT) Patent Appl. No. PCT/US2009/045681 titled "METHOD OF RECONSTITUTING CELLULAR SPECTRA USEFUL FOR DETECTING CELLULAR DISORDERS" having international filing date May 29, 2009, and claiming priority to U.S. Patent Appl. No. 61/056,955 titled "METHOD OF RECONSTITUTING CELLULAR SPECTRA FROM SPECTRAL MAPPING DATA" filed May 29, 2008; and is related to U.S. Provisional Patent Appl. No. 61/358,606 titled "DIGITAL STAINING OF HISTOPATHOLOGICAL SPECIMENS VIA SPECTRAL PATHOLOGY" filed Jun. 25, 2010. All publications, patent applications, patents, and other references mentioned herein are incorporated by reference in their entirety. In case of conflict, the present specification, including definitions, will control. In addition, the materials, methods, and examples are illustrative only and not intended to be limiting. Unless otherwise defined, all technical and scientific terms used herein have the same meaning as commonly understood by one of ordinary skill in the art to which aspects of the present invention belong. Although methods and materials similar or equivalent to those described herein can be used in the practice or testing hereof, suitable example methods and materials are described below.

Among other things, aspects of the present invention describe instrumentation, features, and systems usable for the rapid collection of infrared microscopic data for medical diagnostics, which can be used to detect abnormalities in cells before such abnormalities can be diagnosed using classical cytopathological methods.

DEFINITIONS

For convenience, certain terms employed in the specification, examples, and appended claims are collected here. The initial definition provided for a group or term herein applies to that group or term individually or as part of another group, unless otherwise indicated.

The articles "a" and "an" are used herein to refer to one or to more than one (i.e., to at least one) of the grammatical object of the article. By way of example, "an element" means one element or more than one element.

The term "or" is used herein to mean, and is used interchangeably with, the term "and/or," unless context clearly indicates otherwise.

The term "about" is used herein to mean a value − or +20% of a given numerical value. Thus, about 60% means a value of between 60%−20% and 60%+20% (i.e., between 48% and 72%).

The term "substantially the same" is used herein to mean that two comparing subjects share at least 90% of common features. In certain examples, the common feature may be at least 95%. In certain other examples, the common features may be at least 99%.

The term "intensity" is used herein in accordance with its broad ordinary meaning, which includes measurements of absorbance, transmission, reflective absorbance intensity (transflectance), and the like.

The term "abnormal" refers to cells that have a disorder that may result in a benign disorder, a viral disease, or cancer. Abnormal cells may have spectra and criteria determined from spectra that detectibly differ from "normal" cells. These abnormal cells may visibly appear morphologically normal or undiseased, but have the propensity of developing disorders. "Normal" cells do not have a disorder and may be used as controls. Normal cells may be sampled from subjects that do not have or that do not develop a disorder.

The term "epithelial cell" encompasses all cells lining an organ, including, but not limited to, endothelial cells, mesothelial cells, and urothelial cells, that may be squamous, columnar, or cuboidal.

The term "exfoliated cells" refers to those cells scuffed off, removed, detached, or shed from a tissue surface by natural processes or by physical manipulation. Example methods of collecting exfoliated cells include, but are not limited to, oral or bladder scraping (using a cervical spatula or brush), gynecological exam, filtration from urine, and the like.

As used throughout the disclosure, the term "Spectral Cyto-Pathology" (SCP), unless otherwise indicated, refers to a method of using a micro-spectrometer to obtain mid-infrared spectral data of multiple cells individually and to analyze the resulting spectra by mathematical methods, such as multivariate analysis, for determining the compositional changes of the cells during the transition from a normal to a benign disorder, a virally infected, a pre-cancerous, or a cancerous state.

The analysis of tissue sections by spectral means are referred to as "spectral histo-pathology" ("SHP").

The QCL-based infrared microspectrometer ("QCLIRMS") disclosed herein may be used to substantially improve IR detection at ambient temperatures and accelerate the acquisition of spectral datasets for SCP and SHP and thereby improve the speed, practicality, and general applicability of infrared-based medical diagnostics and prognostics, among other things.

The terms "squamous" "columnar," and "cuboidal" refer to types of epithelial cells that are simple or stratified, keratinized or unkeratinized, and/or ciliated or unciliated.

"Simple" squamous cells can be found lining blood vessels, lymph vessels, the mesothelium of body cavities, and the ascending thin limb of the kidney. "Stratified" squamous cells are found lining the hard palate, the dorsum of the tongue, the gingival, the esophagus, rectum, anus, skin, cervix, vagina, labia majora, orpaharynx, cornea, and the external urethra orifice.

"Simple" columnar cells can be found in the ducts on the submandibular glands, attached gingiva, ductuli, epididymis, vas deferens, seminal vesicle, larynx, trachea, nose, membranous urethra, penile urethra, the stomach, small and large intestine, rectum, gallbladder, ductal and lobular epithelium, fallopian tubes, uterus, endometrium, cervix, ejaculatory duct, bulbourethral glands, and prostrate. "Stratified columnar epithelial cells can be found in the ducts of the submandibur glands attached gingival, ductuli epididymis, vas deferens, seminal vesicle, larynx, trachea, nose, membranus urethra, and penile urethra.

"Simple" cuboidal cells can be found in thyroid follicles, ependyma, the ovaries, tubuli recti, rete testis, respiratory bronchioles, and the proximal and distal convoluted tubules of the kidney. "Stratified" cuboidal cells can be found in the sweat gland ducts.

The term "test cell" refers to a cell sampled from in vivo or in vitro sources that is being analyzed or observed.

The "physiological state" of cell refers to its general health, i.e., whether it is normal or abnormal, and to its propensity to develop abnormalities, including morphological, biochemical, genetic, or other abnormalities, which can lead to cellular disorders.

A "predetermined criterion" is a value characteristic of normal cells or of abnormal cells.

Aspects of the present invention include methods, systems, and devices for providing coherent or non-coherent transmission sources for use with detecting and analyzing spectral data, including such data as may be obtained from tissue samples. In one example variation in accordance with aspects of the present invention, an IR tunable laser is used as the coherent transmission source. In some variations, the wavelength of IR transmissions from the tunable laser is varied in discrete steps across the spectrum of interest, and the transmitted and/or reflected transmissions across the spectrum may be detected and used in image analysis. Because of the magnitude of transmissions and detection obtained with use of an IR tunable laser, with such variations, the need for use of cooling of the detectors and associated space and other costs may be greatly reduced, among other things.

One example laser usable in accordance with aspects of the present invention is the quantum cascade laser (QCL), which may allow variation in IR wavelength output (e.g., IR radiation) between about six and 10 µm, for example. Other types of lasers may also be used to produce output across a similar range of wavelengths. However, many such other lasers may be significantly more expensive, may generally not be appropriate for use by a pathologist or others that may be assessing the images produced, and/or have other drawbacks over QCL.

In one example implementation, the overall set of system components for producing the variation in IR wavelength output via a QCL, directing and appropriately magnifying and/or focusing the output to the sample to be viewed, and detecting transmitted and/or reflected IR wavelength image information is configurable and containable within a housing having dimensions enclosing approximately one cubic foot or less.

In this example of the system in accordance with aspects of the present invention, an arrangement (e.g., array) of detectors is utilized in which each element detects an area in the range of 30×30 µm at room temperature. The arrangement of such detectors may be in, for example, an array of 320×280 such detectors, producing an image space of 89,600 such detectors (such array detector examples are interchangeably referred to herein as a "microbolometer array detector" or "MBA" of "focal plane array" (FPA) detectors).

In operation, with minimal magnification using features in accordance with aspects of the present invention, a beam output from the QCL may suitably illuminate each region of a sample in the range of about 10×10 µm for detection by a 30×30 µm detector. Thus, the system in accordance with aspects of the present invention contains features and operates unlike an IR microscope.

In one example implementation in accordance with aspects of the present invention, the beam of the QCL is optically conditioned to provide illumination of a macroscopic spot (ca. 5-8 mm in diameter) on an infrared reflecting or transmitting slide, on which the infrared beam interacts with the sample. The reflected or transmitted infrared beam is projected, via suitable imaging optics, to the infrared array detector, which samples the complete illuminated area at a pixel size (spatial resolution) of about the diffraction limit.

The sample may, for example, consist of a microtome section of tissue from biopsies, or a deposit of cells from a sample of exfoliated cells. However, the disclosure is not limited to these biological samples, but may include any sample for which spatially resolved infrared spectroscopic information is desired.

A variety of cells may be examined using the present methodology. Such cells may be exfoliated cells, including epithelial cells. Epithelial cells are categorized as squamous epithelial cells (simple or stratified, and keratinized, or non-keratinized), columnar epithelial cells (simple, stratified, or pseudostratified; and ciliated, or nonciliated), and cuboidal epithelial cells (simple or stratified, ciliated or nonciliated). These epithelial cells line various organs throughout the body such as the intestines, ovaries, male germinal tissue, the respiratory system, cornea, nose, and kidney. Endothelial cells are a type of epithelial cell that can be found lining the throat, stomach, blood vessels, the lymph system, and the tongue. Mesothelial cells are a type of epithelial cell that can be found lining body cavities. Urothelial cells are a type of epithelial cell that are found lining the bladder. These cell types have been distinguished by the method described here.

The infrared spectra of voxels of tissue or cells represent a snapshot of the entire chemical or biochemical composition of the sample voxel. This composition changes during the transition from a normal to a cancerous state, and disease can be detected by multivariate statistical analysis or other mathematical procedures of the spectra collected from cells or tissue. Consequently, infrared micro-spectroscopy, in conjunction with suitable methods of multivariate analysis, can be used to monitor the state of health of a human cell, or the presence of cancerous areas in a section of tissue.

SCP has been used in the diagnosis of precancer, cancer and viral infection in both oral and cervical cells (see, e.g., PCT Appl. No. US2009/0481 of Diem, et al.). In addition, several optical effects have been described including Mie scattering of infrared wavelengths from the nuclei of cells and optical effects resulting from reflectance contributions, which are mixed with absorption features via an effect that has been referred to as "resonance Mie" scattering. Understanding of these optical effects was followed by methods of correcting contaminated spectra.

The methods of analysis developed for data sets with such large variance use a two-pronged approach. First, methods of unsupervised multivariate statistics were employed to investigate whether or not the dataset contains quantifiable differences. To this end, Principal Component Analysis (PCA), was used.

The second approach for analyzing spectral datasets from individual cells utilizes trained or supervised algorithms. When unsupervised methods are able to distinguish spectral patterns, discriminant algorithms can be devised that can classify cells based on the spectral data and correlations from standard cyto-pathology or cell biology. In this way, the discrimination of epithelial cells in different stages of the cell cycle via artificial neural networks (ANNs), and/or other devices and/or algorithms, trained on a subset of the available spectral data can be carried out. Mature cervical cells can also be distinguished from immature human cervical cells, as well as the cells from menopausal women compared with those well before the onset of menopause.

Data repositories have been constructed of normal exfoliated cells to establish the normal distribution of cells found in cervical, oral and urine samples. These results form the basis of any future application of spectral cyto-pathology, and have demonstrated the exquisite sensitivity of spectral cytology toward cell maturation and differentiation, and stages of disease.

SCP and SHP have the necessary sensitivity and specificity for the detection and diagnosis of disease. These spectral methods have several important advantages over classical cytology and pathology, which are presently carried out by visual (microscopic) inspection of stained cells and tissues. SCP and SHP results are based on physical measurements via a spectrometer with high reproducibility and repeatability, which are digitally recorded and stored. Interpretation of the measured spectrum is carried out by a self-learning algorithm, trained against the best available, consensus-based gold standard, and evaluates spectral data by reproducible and repeatable criteria. Both the spectral measurement and the data analysis are completely machine-based, and not subject to operator fatigues and expertise. SCP and SHP, after appropriate instrument validation and algorithm training, will produce the same results worldwide. Also, rather than relying on visually assigned criteria such as normal, atypical, low grade neoplasia, high grade neoplasia and cancer, the results of spectral cytology for each cell can be represented by an appropriately scaled numeric index.

An at least 10-fold reduction in data acquisition, while preserving or improving the data quality, may be obtained over art systems. This data reduction is obtained using calculations taking into account the photon flux, detectivity of the detector elements, laser tuning speed, and read-out rates of the array detector.

The reduced data acquisition times makes practical the automatic analysis of exfoliated cells, to screen for cancer, precancer and viral infection. In addition, the same or a similar instrumental platform can be used to image tissue section for many histopathological procedures, such as an improved cervical cancer screening tests. The overall accuracy of the standard cytological cervical test is about 65%. In addition, a similar methodology, with differing diagnostic algorithms, for example, may be used to diagnose oral cancers, such as squamous cell carcinomas (SCC) of the oral cavity. These cancers are a direct by-product of tobacco use, and are on the rise.

The following are example commercial applications of SCP/SHP: oral cancer screening (SCP); cervical cancer screening (SCP); HPV testing; oral cavity/cervix (SCP); breast cancer metastases in axillary lymph nodes (SHP); breast cancer—margins of recession (SHP); breast cancer—fine needle aspirate (SHP); and lung cancer fine needle aspirate (SHP).

Disorders affecting any of these cell samples are detectable using methods, systems, and devices in accordance with aspects of the present invention. For example, variations of methods herein may be used to detect viral infections, such as, but not limited to, Herpes simplex, HPV, and Epstein Barr virus, and disorders such as dysplasia and malignancy-associated changes indicative of cancer, and changes of cellular maturation and differentiation that can be indicative of a pre-disease state such as benign reactive changes including hyperplasia, metaplasia, and inflammation.

Several experiments have been performed that have established the utility of the reconstructed spectra generated according to the method and system described above. For example, reconstructed spectra have been generated for three broad categories of cells: (a) normal cells collected from normal patients; (b) cells that appear morphologically normal that were collected from patients known to have a disorder; and (c) cells that appear morphologically abnormal that were collected from patients known to have a disorder. Conventional morphological analysis can discriminate between types (a) and (c) (i.e., cells that appear morphologically normal and cells that appear morphologically abnormal). However, conventional morphological analysis does not discriminate between types (a) and (b) (i.e., normal cells and cells that visually appear normal that were collected from patients with known disorders). However, as described below, the reconstructed spectra of the type (b) cells (i.e., cells that visually appear normal that were collected from patients with known disorders) are different than, and can be discriminated from, the type (a) cells (i.e., normal cells). Methods described below readily and automatically discriminate between type (a) cells and type (b) cells thus allowing earlier and more reliable diagnosis than is possible with conventional morphological techniques.

EXAMPLE IMPLEMENTATIONS

Figure 4:
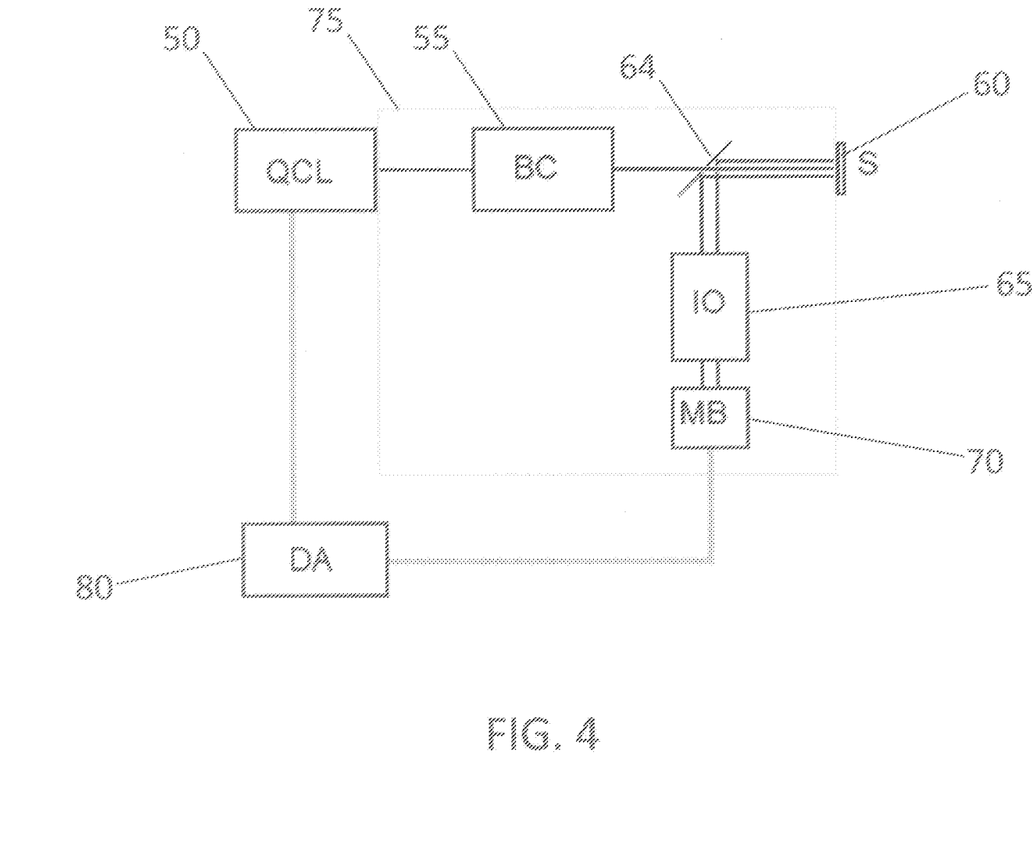
FIG. 4 shows a representative block diagram of various features of an example QCL infrared microspectrometer usable in accordance with aspects of the present invention.

FIG. 4 shows a representative block diagram of various features of an example QCLIRMS in accordance with aspects of the present invention. The instrumental concept introduced here is equally applicable to SCP and SHP. In the example shown, a coherent IR transmission source 50, such as a tunable QCL, replaces the thermal (black-body) source and the interferometer of some art devices. In some cases, for example, a broadband tunable (1800 to 900 $cm^{-1}$, or 5.5 to 11 µm) QCL may provide suitable excitation of the sample, although initially, QCLs with lower tuning range may be used. Coherent wavelength laser output>20 mW over the entire spectral range may be provided, for example, at 0.5 cm$^{-1}$ bandwidth. Suitable such lasers are readily available. The diameter of the beam of such lasers may be >5 mm in diameter, for example. The laser may be electronically tunable over the wavelength range, and a wavelength may be selected within a few ms.

Optional beam conditioning optics 55 may be performed to focus the laser output to the desired size and beam profile. The output may then be directed to the sample 60, which may comprise, for example, tissue mounted or deposited on a reflective and/or transmissive slide. The output transmitted, reflected, and/or transflected by the sample 60 is collected and may be focused, such as by imaging optics 65, and optionally directed 64, such as by a reflector, to a room temperature detector 70, such as a 640×480 pixel microbolo-meter array (MPA). The specific detectivity D* of VOx microbolometer arrays may, for example, be about $2 \times 10^8$ cm Hz$^{1/2}$/W. Such level of detectivity, in conjunction with the high power output of the QCL, may readily produce spectra with improved signal to noise ratio ("S/N") relative to art systems.

The image collection system 75 of FIG. 4 may have a footprint of about 12 inches×6 inches, and be about 10 inches tall, for example, and may be housed in a permanently sealed case that is filled with an inert gas to reduce water vapor interference. The microscope slide, with the reflective surface/sample pointing down, can be positioned manually, or via an automatic slide feeder, into a slide holder on top of the unit.

Data received from the detector 70 may then be processed by a processing device 80, such as a terminal or other data acquisition unit (DA), as described further below.

As will be described further below with reference to FIG. 5, in infrared imaging mode, the light emitted from the QCL may be focused via the source Cassegrain, and focused into the Cassegrain objective such that only one half of the circular aperture, for example, is illuminated. The laser light may pass an infrared transparent window, comprising, for example, barium fluoride, before being transflected by the sample mounted on silver-coated reflective slides ('low-e' slides). The other half of the Cassegrain may re-collect received reflected output and focuses the output onto a detector Cassegrain, which expands the image such that, for example, a sample pixel 7 μm on edge fills the detector element, which may measure between 17 μm×17 μm to 25 μm×25 μm on edge, for example, depending on the detector array used.

In a separate visible imaging mode, a 45° mirror may be inserted before the Cassegrain objective to illuminate the entire aperture of the objective with visible light, such as may be produced by a superbright LED. This visible light may be transmitted by the sample to the low-e slide, and focused to a detector, such as a standard CCD, which collects the visual image data for the sample.

Figure 5:
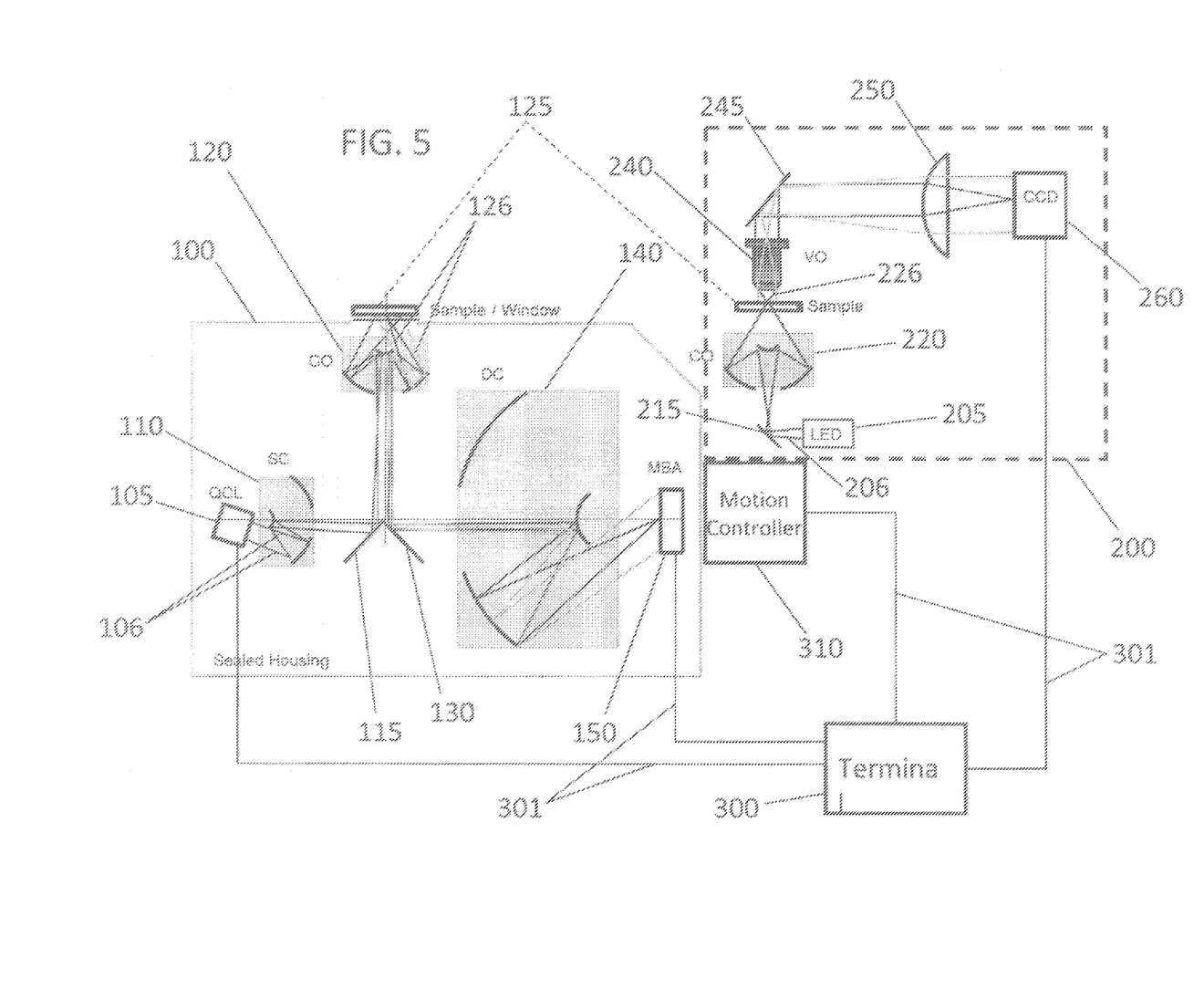
FIG. 5 contains a representative diagram of an example system for collecting IR data from an image sample using a tunable laser based IR source, in accordance with aspects of the present invention.

As shown in FIG. 5, for example, aspects of the present invention may include an IR source subsystem 100 that comprises a tunable variable IR output device 105, such as tunable IR laser (e.g., a QCL), the output 106 of which (e.g., a single wavelength beam at any given setting) is transmitted into a rectifying device 110, such as a source Cassegrain (SC). A microscope lens may not be used for such device 110, for example, because of the insuitability of such a lens for transmission of IR, unless such a lens system is constructed from IR-transmitting materials.

Upon exit of the output 106 from the rectifying device 110, optionally, the output 106 may be re-directed via a redirecting mechanism 115, such as an IR reflector, to a magnifying or demagnifying device 120, such as Cassegrain objective (CO). From the (de)magnifying device 120, the output 106 after focusing may be directed to a sample to be imaged 125, such as a tissue sample on a slide. In one example variation in accordance with aspects of the present invention, the sample to be imaged 125 may be a slide containing a tissue sample and having a backing (e.g., a thin silver based coating) for reflecting the output 106 so as to allow transflection measurement. Such coating may be transmissive of the visible spectrum, for example.

From the sample to be imaged 125 transmitted and/or reflected output 126 is directed to a focusing and magnifying device 140, such as a detector Cassegrain (DC). In one example variation in accordance with aspects of the present invention, the output 126 may be re-directed via a redirecting mechanism 130, such as a reflector. Within the focusing and magnifying device 140, the output 126 may be magnified and directed to a detection device 150, such as an MBA. For example, the magnification may be such that the output 126 is sized to match the size of one detector in the detection device 150 (e.g., reflected output 126 of 10×10 μm area of sample magnified by a factor of three so as to magnify the area imaged to be received for detection by a corresponding 30×30 μm detector within the overall detection device 150, which, for example, may be about 5×7 mm in size).

Also shown in FIG. 5 is an optional secondary detection subsystem 200, such as a visible light detector subsystem, usable with in conjunction with subsystem 100. The optional secondary detection subsystem 200 may, for example, be wholly or partially positionable operationally between the sample to be imaged 125 and the IR detection subsystem 100 and be designed to be moved and to produce corresponding movement of the IR detection subsystem 100 when so positioned. For example, the secondary detection subsystem 200 may comprise visible light detection features for allowing a user to obtain visual sample information in a manner that allows the user to visually position the secondary detection subsystem 200, so as to properly align the sample to be imaged 125 relative to a visible illumination source and thereby also correspondingly align IR output from the IR detection subsystem 100 with the sample to be imaged (e.g., one aim may be to collect a visual image that permits correlation and co-localization between infrared and visual images).

As shown in FIG. 5, subsystem 200 may include, for example, a visible output device 205, such as a visible light source (e.g., one or more light emitting diodes or LEDs). Output 206 from the visible output device 205 may be directed to a focusing device 220, such as CO for focusing visible light (note: in some variations, the focusing device 220 for the subsystem 200 may be the same focusing device 120 used in subsystem 100). The output 206 may, for example, also optionally be re-directed to the focusing device 220 via a redirecting device 215 (e.g., a mirror).

The output 206, after focusing by the focusing device 215, may be transmitted and/or reflected through the sample to be imaged 125 (e.g., a tissue sample on a slide). The transmitted and/or focused output 226 may then be directed to a visible light magnifying device 240, such as a visible light objective (VO). From the magnifying device 240, the output 206 may optionally be further directed, for example via a reflecting device 245 (e.g., a mirror) and a focusing lens 250, to a detection device 260, such as a visible light detector (e.g., charge-coupled device or CCD camera).

The system of FIG. 5 may further include a control subsystem comprising one or more terminals 300, such as one or more personal computers (PCs), minicomputers, mainframe computers, microcomputers, telephonic devices, or wireless devices, such as personal digital assistants ("PDAs") or handheld wireless devices for controlling operation of the system and for receiving, storing, and processing data. The one or more terminals 300 may include a processor and a repository for data and/or couplings to a repository for data, via, for example, a network, such as the Internet or an intranet. The couplings may include, for example, wired, wireless, or fiberoptic links.

The one or more terminals 300 may be coupled (e.g., couplings 301) to one or more of the IR output device 105, the detection device 150, the detection device 260, and/or one or more motion control devices 310 (e.g., servomotors) for controlling the position of the sample to be imaged 125 relative to the output 106 and/or the output 226, all or some of which may also comprise portions of the control subsystem.

In operation, the one or more terminals 300 may, for example, when the secondary detection subsystem is enabled to receive data from the detection device 260, process the data received, and produce an output (e.g., display an image on a display) corresponding to the visible light transmitted through the sample to be imaged 125. Upon properly positioning the sample to be imaged 125 relative to the IR detection subsystem 100 for the first 10×10 µm portion of the sample to be imaged 125, the one or more terminals 300 may also cause the IR output device 105 to sequence through one or more wavelength settings to produce corresponding output 106 for a certain length of time for each wavelength, obtain and store any data output from the detector 150 corresponding to each output wavelength, and then move the relative positions and similarly re-image and store obtained data corresponding to each remaining 10×10 µm portion of the sample to be imaged 125.

In operation, for example, a tunable QCL with a range of IR output (e.g., 1800 to 900 $cm^{-1}$) may be set to produce a first transmission at a first wavelength in the range (e.g., 1799.5 $cm^{-1}$) for the entire illuminated area of a tissue (or, e.g., for a cell) sample on a slide at each detector element of the MBA. The image corresponding to this wavelength (e.g., 1799.5 $cm^{-1}$) is stored in a data repository on a terminal. This process is repeated for the next wavelength increment of the QCL (e.g., 1790.0 $cm^{-1}$), and so on throughout the entire wavelength range of the QCL for all 10×10 µm portion of the sample.

Indensity values for each pixel of the detector element, collected at different laser wavelengths, are combined to form an infrared spectrum corresponding to the particular pixel position. All spectra, referenced by their respective pixel position, are combined into a data construct known as the "spectral hypercube."

From the total data is acquired (the entirety of the data interchangeably referred to herein as a "spectral hypercubes" and/or "hyperspectral datasets"), initial processing is performed to reconstruct the data into a "univariate map" or "chemical image," for example, that highlights the abundance of particular chemical constituents in the sample. See, e.g., Milos Miljkovic, "Label-Free Imaging of Human Cells: Algorithms for Image Reconstruction of Raman Hyperspectral Datasets," Analyst (2010), pp. 2002-2013 (The Royal Society of Chemistry), the contents of which are hereby incorporated by reference in their entirety.

Initial processing may include, for example, reconstruction of cellular spectra for cells in a sample, which may be generated as follows (see also, e.g., PCT Appl. No. US200910481 of Diem, et al.). Raw data sets from the infrared microspectrometers may be imported into software that reconstructs the spectra of individual cells, collected in mapping mode, preferably from between 9 and 100 individual pixel spectra for each cell. It does so by establishing which pixel spectra belong to a given cell of the image map. This process is accomplished by constructing a binary mask in which contiguous regions belonging to individual cells are identified. This mask may be established by defining a threshold for the amide I intensity. For each contiguous area occupied by a cell, the cellular spectrum is calculated, starting from the spectrum with the largest amide I intensity. This spectrum is presumably from the nucleus of the cell, which always exhibits the strongest protein intensity. Once the binary mask associates spectra with their cells, all spectra are subsequently co-added and, subject to several constraints to ensure spectral quality. These criteria are imposed to prevent the co-addition of very weak spectra with poor signal-to-noise to contaminate the cell spectrum, such as spectra from the edges of a cell, which may be contaminated by dispersion artifacts. The co-added cellular spectra, as well as the coordinates of each cell, are then exported for further data analysis.

This method is now described in more detail, as follows.

Infrared spectral data of the cellular sample are collected from the entire sample area on the microscope slides to generate a dataset. On a pixel-by-pixel basis, the lowest intensity value of each pixel's spectrum is subtracted from each intensity value in the same pixel's spectrum to remove any intensity offset and to ensure that all spectra have positive intensity values. For example, a pixel P can include the set of measurements $(I1, I2, \ldots, IN)$, where each measurement In represents an intensity at a particular wavenumber. If Ij is the lowest of these N values, then after this step the pixel P will have the values $(Ii-Ij, I2-IJ, ---, IN-IJ)$. This normalization step is performed for each pixel.

A spectral map of the entire sampling area is created using the subtracted spectral data generated in the previous step. The number of pixels in the spectral map is based on the sample area scanned at the predefined pixel size. The spectral map may be created by assigning a gray-scale value to each pixel. This grayscale value can be based on the integrated area of the "amide I" band, which occurs between wavenumbers ca. ("approximately") 1640 and 1670 $cm^{-1}$ in the infrared spectra of all proteins.

Pixels with high integrated intensities in the amide I band may be assigned white or light gray shades, and pixels with the lowest intensities may be assigned black or dark grey shades. The pixels with intensities in between the highest and lowest intensity values may be linearly mapped onto the grayscale scale between black and white. The spectral map may also be generated as a color image, instead of as a grayscale. The grayscale value may also be based on, for example, the intensity of any band in the spectral region, the ratio between two intensity points in the spectral region, the integrated area between two intensity points in the spectral region or the ratio of the integrated area between two spectral regions.

The manner in which the amide I intensity of a pixel is determined will now be discussed. The peak at about 1650 $cm^{-1}$ (known as the amide I band) arises from carbonyl stretching vibrations of the peptide backbone in cell proteins, and is an indication of the presence of a cell. Thus, the amide I intensity is determined by locating the intensity peak that is closest to wavenumber 1650 $cm^{-1}$. A minimum amide I intensity threshold value is set. For example, the minimum amide I intensity threshold value may be set to 0.15 absorbance units in order to reject any pixel that has no well-defined protein vibrations, and is therefore not due to a cell. A value of 0.15 for this threshold corresponds to a situation in which the intensity of the beam received by the detector divided by the intensity of the beam incident on the sample is equal to 0.15. The grayscale map is converted to a binary map by using the threshold. Each pixel in the binary map corresponds to one pixel in the spectral map, and each pixel in the binary map is set to one of two values (e.g., either white or black). A pixel from the spectral map is selected and the amide I intensity value in the pixel spectra is identified. The amide I intensity value is compared with the minimum amide I intensity threshold value. If the amide I intensity value is greater than or equal to the threshold, the corresponding pixel in the binary map is assigned white color. If the amide I intensity value is less than the threshold, the corresponding pixel in the binary map is assigned black color. This process is repeated until all pixels in the spectral map have been selected.

Contiguous white areas in the binary map are identified and associated with a cell or clump of cells. Next, an initial number of cells in the binary map is identified based on the groups of contiguous white areas (i.e., the number of contiguous white areas is counted). Position coordinates of each pixel are stored.

The binary map may be refined by removing pixels associated with clumps of cells, and/or contaminants. For example, upper and lower limits for the number of pixels contributing to one cell can be set in order to remove from the binary map pixels contributing to overlapping squamous cells measuring more than about 60 um across. As an example, an upper limit of 90 pixels prevents contiguous white pixels in the binary map that correspond to large mature squamous cells, or that correspond to large clumps of overlapping cells, from being further analyzed. The lower limit for the number of pixels defining a cell can be set at about 15 to prevent contiguous white pixels in the binary map that correspond to contaminants from being further analyzed. Thus, the method screens out regions of contiguous white pixel areas in the binary map that are either too big or too small to be cells of interest. These steps in effect produce a refined binary map, by discarding the regions that were too big or too small. The resulting binary map delineates the pixels that belong to cells of interest in the sample. The number of cells in the sample is updated to equal the number of cells identified in the refined binary map.

The spectrum of each cell identified in the binary map is reconstituted from the individual pixel spectra. A single cell is selected from the cells identified in the refined binary map produced and the pixel in the cell that has the highest amide I intensity value is identified. Next, a white pixel that is associated with the same cell and that is adjacent to the pixel is identified. Two criteria (both of which are described below) of the selected pixel are checked. If the pixel meets both criteria, then the spectrum of the selected pixel is co-added to the spectrum of the prior pixel. This co-added spectrum is a "reconstructed" spectrum. The pixel could be selected by, for example, the intensity of any band in the spectral region, the ratio between two intensity points in the spectral region, the integrated area between two intensity points in the spectral region or the ratio of the integrated area between two spectral regions.

The first of the two criteria is a check to compare the amide I intensity in the pixel with a threshold intensity value to determine whether the amide I intensity is greater than or equal to the threshold intensity value. The threshold can be set to a predefined percentage (e.g., 66 percent) of the percentage of the value of the pixel in the cell that had the highest amide I intensity. If the value of the pixel is below the threshold, then the pixel is discarded (i.e., its spectrum is not co-added to that of other pixels in the cell). This evaluation eliminates pixel spectra associated with the outer edges of the cytoplasm, which are generally thin, and are associated with weak and noisy spectra. If the pixel meets the amide I intensity criteria, the wavenumber corresponding to amide I intensity in the pixel is compared with the wavenumber corresponding to the highest amide I intensity in the cell. If the value is not equal, then the shift in the value from the maximum value is determined and compared with a threshold amide I wavenumber shift value. For example, the threshold wavenumber shift value can be set to 4 $cm^{-1}$. If the amide I wavenumber shift of the pixel is less than or equal to the threshold wavenumber shift value, then the spectrum of the pixel is co-added to that of other pixels in the cell. Otherwise, the pixel is discarded and not co-added with other pixels.

The co-added spectrum of each cell is stored along with the position coordinates of the cell. The cell spectrum can be constructed by co-adding typically from about 30 to about 70 individual pixel spectra.

Alternately, the reconstructed spectra may be generated by any of the following: (a) measuring the intensity at any wavenumber; (b) calculating the ratio between two intensity values at any wavenumber; (c) calculating the integrated area between two intensity values at any wavenumber; or (d) calculating the ratio of an integrated area between two intensity values at any wavenumber. The spectral map can be based on any selected intensity, as opposed to just the intensity or the integrated area of the amide I band. Similarly, the minimum threshold value can be compared to any selected value of the pixel as opposed to the amide I intensity value. Also, a pixel can be selected based on having a maximum value at any selected wavenumber and the wavenumber corresponding to amide I need not be used. Then pixels are retained or discarded based on intensity at a particular wavenumber and again the wavenumber corresponding to amide I need not be used.

Once all of the data is acquired, stored, and initially processed, the total data pattern is assessed. For example, if the sample to be imaged is a tissue sample, the spectral data pattern for that tissue sample may be assessed relative to diseased tissues to determine the likelihood of disease being present. For example, such assessment may include analysis of spatial variations of chemical composition in the sample (e.g., cancer presence in the tissue may produce an abnormal composition spectrum relative to healthy tissue).

Figure 6:
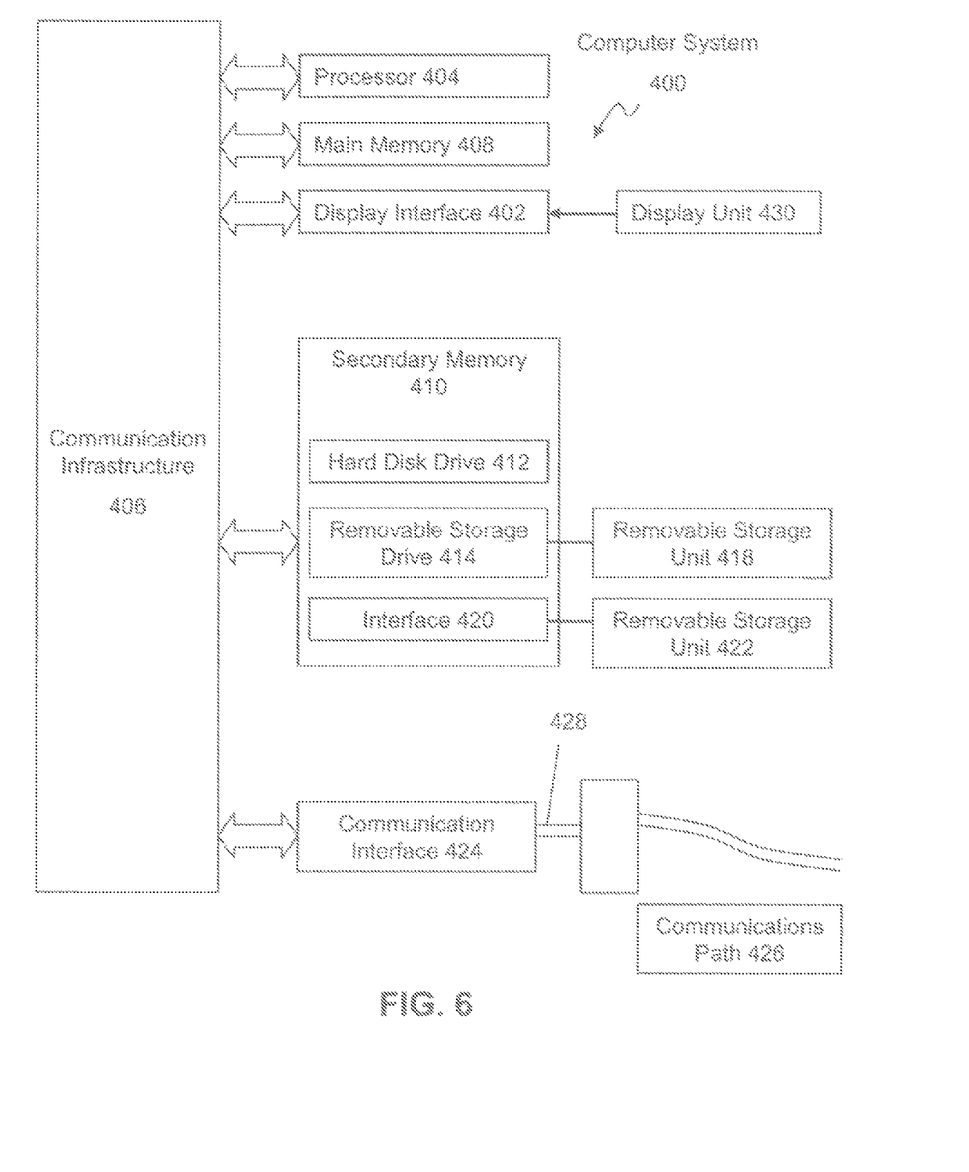
FIG. 6 shows an exemplary system diagram of various hardware components and software and other features, for use in accordance with aspects of the present invention.

Aspects of the present invention may be implemented using hardware, software, or a combination thereof and may be implemented in one or more computer systems or other processing systems. In an aspect of the present invention, features are directed toward one or more computer systems capable of carrying out the functionality described herein. An example of such a computer system 400 is shown in FIG. 6.

Computer system 400 includes one or more processors, such as processor 404. The processor 404 is coupled to a communication infrastructure 406 (e.g., a communications bus, cross-over bar, or network). Various software aspects are described in terms of this example computer system. After reading this description, it will become apparent to a person skilled in the relevant art(s) how to implement aspects hereof using other computer systems and/or architectures.

Computer system 400 may include a display interface 402 that forwards graphics, text, and other data from the communication infrastructure 406 (or from a frame buffer not shown) for display on a display unit 430. Computer system 400 may include a main memory 408, preferably random access memory (RAM), and may also include a secondary memory 410. The secondary memory 410 may include, for example, a hard disk drive 412 and/or a removable storage drive 414, representing a floppy disk drive, a magnetic tape drive, an optical disk drive, etc. The removable storage drive 414 may read from and/or write to a removable storage unit 418 in a well-known manner. Removable storage unit 418, represents a floppy disk, magnetic tape, optical disk, etc., which may be read by and written to removable storage drive 414. As will be appreciated, the removable storage unit 418 may include a computer usable storage medium having stored therein computer software and/or data.

Alternative aspects of the present invention may include secondary memory 410 and may include other similar devices for allowing computer programs or other instructions to be loaded into computer system 400. Such devices may include, for example, a removable storage unit 422 and an interface 420. Examples of such may include a program cartridge and cartridge interface (such as that found in video game devices), a removable memory chip (such as an erasable programmable read only memory (EPROM), or programmable read only memory (PROM)) and associated socket, and other removable storage units 422 and interfaces 420, which allow software and data to be transferred from the removable storage unit 422 to computer system 400.

Computer system 400 may also include a communications interface 424. Communications interface 424 may allow software and data to be transferred among computer system 400 and external devices. Examples of communications interface 424 may include a modem, a network interface (such as an Ethernet card), a communications port, a Personal Computer Memory Card International Association (PCMCIA) slot and card, etc. Software and data transferred via communications interface 424 may be in the form of signals 428, which may be electronic, electromagnetic, optical or other signals capable of being received by communications interface 424. These signals 428 may be provided to communications interface 424 via a communications path (e.g., channel) 426. This path 426 may carry signals 428 and may be implemented using wire or cable, fiber optics, a telephone line, a cellular link, a radio frequency (RF) link and/or other communications channels. As used herein, the terms "computer program medium" and "computer usable medium" refer generally to media such as a removable storage drive 480, a hard disk installed in hard disk drive 470, and/or signals 428. These computer program products may provide software to the computer system 400. Aspects of the present invention are directed to such computer program products.

Computer programs (also referred to as computer control logic) may be stored in main memory 408 and/or secondary memory 410. Computer programs may also be received via communications interface 424. Such computer programs, when executed, may enable the computer system 400 to perform the features in accordance with aspects of the present invention, as discussed herein. In particular, the computer programs, when executed, may enable the processor 410 to perform the features in accordance with aspects of the present invention. Accordingly, such computer programs may represent controllers of the computer system 400.

Where aspects of the present invention may be implemented using software, the software may be stored in a computer program product and loaded into computer system 400 using removable storage drive 414, hard drive 412, or communications interface 420. The control logic (software), when executed by the processor 404, may cause the processor 404 to perform the functions described herein. In another aspect of the present invention, the system may be implemented primarily in hardware using, for example, hardware components, such as application specific integrated circuits (ASICs). Implementation of the hardware state machine so as to perform the functions described herein will be apparent to persons skilled in the relevant art(s).

In yet another variation, aspects of the present invention may be implemented using a combination of both hardware and software.

EXAMPLE

Presently Utilized SCP and SHP Instrumental Methods for Data Acquisition

A review of the literature indicates that recently published reliable SHP and SCP results were collected using commercially available or modified spectrometers that are based on interferometric principles. In these instruments, infrared light from a broadband source (typically a blackbody radiator heated to between 1300 and 2000 K) is modulated by a Michelson-type interferometer, focused onto the sample via a Cassegrain objective, collected via the same or another Cassegrain, and focused onto a detector in the focal plane. Commercial instruments use either photovoltaic HgCdTe detector arrays that vary in size from 64×64 to 256×256 elements, or 8×2 element photoconductive HgCdTe detectors. Both of these detector types need to be operated at cryogenic temperatures, typically 77° K. The interferograms collected for each detector element (and, consequently, from each sample pixel area) are Fourier transformed, and ratioed against a background spectrum to produce the transmittance or absorbance spectrum of each sample point.

Most recent reports reviewed were carried out in absorption-reflection (also known as transflection) mode for samples prepared on specially coated microscope slides that are transparent in the visual spectral range, but completely reflective in the infrared. These "low-e" slides are commercially available at low cost, (e.g., Kevley Technologies, Chesterland, Ohio). At the point of infrared data acquisition, the samples are not yet stained, since the stains would interfere with spectral data acquisition.

For the following description, the instruments identified are provided as examples only, and the discussion is not limited to these instruments. For SHP, an area of the (unstained) tissue may be selected visually via the IR microscope for data acquisition. The instrument subsequently collects spectral data from individual pixels 6.25 μm×6.25 μm in size. Multiple data acquisition for each pixel is allowed to improve the signal quality. The final dataset is stored in native instrument format, and exported for remote processing.

While image data acquisition of areas measuring up to several millimeters square is standard procedure in SHP, an imaging approach to SCP to simplify and speed up the data acquisition may also be used. In one example of implementation of this approach, the entire sampling area of a cell deposit is mapped at a pixel size of about 6.25 μm×6.25 μm. The algorithm of this example method subsequently reconstructs the cellular spectra from individual pixel spectra.

Although these instruments give generally satisfactory data, the acquisition of datasets of medical significance take significantly longer than the time a pathologist or cytologist would spend on a single slide. In SHP, the data acquisition of a 1 mm×1 mm area of a tissue section, at the desired signal quality, requires the collection of 25,600 spectra at 6.25 μm pixel size, and takes ca. 40 min. The instruments for data acquisition ideally should use room temperature detectors to avoid the use of cryogenic coolants, such as liquid nitrogen, and should be "push-button operable."

Example aspects of the present invention have now been described in accordance with the above advantages. It will be appreciated that these examples are merely illustrative hereof. Many variations and modifications will be apparent to those skilled in the art.

We claim:

1. A system for obtaining imaging information, comprising:
   a coherent source laser for producing infrared radiation;
   an infrared magnifier for receiving and magnifying the infrared radiation for transmission to at least a portion of a sample to be imaged, wherein the infrared radiation is reflected from or transmitted through the sample;
   a magnifying and focusing device for receiving the reflected or transmitted infrared radiation and for magnifying and focusing the reflected or transmitted infrared radiation; and
   an infrared detecting device for receiving the magnified and focused infrared radiation for transmission to a processing device for analysis, wherein the infrared detecting device is a microbolometer array detector comprising a plurality of detector elements,
   wherein the coherent source laser is configured to generate a power density sufficient to illuminate the sample for detection by each detector element in the microbolometer array detector.

2. The system of claim 1, wherein the coherent source laser is incrementally variable by wavelength across the infrared spectrum.

3. The system of claim 1, wherein the coherent source laser is a linear or non-linear optical device producing tunable infrared laser radiation by sum or difference frequency generation.

4. The system of claim 1, wherein the coherent source laser is a quantum cascade laser.

5. The system of claim 1, wherein the infrared radiation produced by the coherent source laser is radiation in at least one discrete wavelength between about 5 and 10 μm.

6. The system of claim 1, wherein the infrared magnifier is a source Cassegrain.

7. The system of claim 1, wherein the magnifying and focusing device is a Cassegrain objective.

8. The system of claim 1, further comprising:
   a redirecting mechanism for redirecting the infrared radiation magnified by the infrared magnifier to the magnifying and focusing device.

9. The system of claim 8, wherein the redirecting mechanism is an infrared reflector.

10. The system of claim 1, wherein the specific detectivity of the microbolometer array detector is about $2 \times 10^8$ cm $Hz^{1/2}$/W.

11. The system of claim 1, wherein the infrared detecting device is configured to operate at room temperature.

12. A system for obtaining imaging information, comprising:
   an infrared imaging subsystem, including:
      a coherent source laser for producing infrared radiation;
      an infrared magnifier for receiving and magnifying the infrared radiation for transmission to a portion of a sample to be imaged, wherein the infrared radiation is reflected from or transmitted through the sample;
      a magnifying and focusing device for receiving the reflected or transmitted infrared radiation and for magnifying and focusing the reflected or transmitted infrared radiation; and
      an infrared detecting device for receiving the magnified and focused infrared radiation, wherein the infrared detecting device is a microbolometer array detector comprising a plurality of detector elements,
      wherein the coherent source laser is configured to generate sufficient power density to illuminate the sample for detection by each detector element in the microbolometer array detector;
   a secondary detection subsystem, including:
      a visible light emission source;
      a visible light magnifier for receiving and magnifying visible light output from the visible light emission source for transmission to a portion of the sample to be imaged, wherein the visible light is reflected from or transmitted through the sample;
      a lens for focusing the reflected or transmitted visible light; and a visible light detection device for receiving the reflected or transmitted visible light output; and
   a control subsystem, including:
      a processing device; and
      a motion control device operatively coupled to the processing device;
      the processing device configured to:
         move at least a portion of the secondary detection subsystem relative to the sample to be imaged to a position located between the sample and the infrared imaging subsystem thereby enabling alignment of the visible light detection device and the infrared detecting device; and
         receive data from the infrared detecting device and the visible light detection device corresponding to portion of the sample to be imaged and to process the data for analysis of the composition of the sample to be imaged.

13. The system of claim 12, wherein the visible light emission source is a light emitting diode.

14. The system of claim 12, wherein the magnifier for receiving and magnifying visible light output is a Cassegrain objective.

15. The system of claim 12, further comprising:
   a magnifier for magnifying the reflected or transmitted visible light.

16. The system of claim 15, wherein the magnifier for magnifying the reflected or transmitted visible light is a visible light objective.

17. The system of claim 12, wherein the visible light detection device comprises a charge-coupled device.

18. The system of claim 12, wherein the specific detectivity of the microbolometer array detector is about $2 \times 10^8$ cm $Hz^{1/2}$/W.

19. The system of claim 12, wherein the infrared detecting device is configured to operate at room temperature.

20. A method for obtaining imaging information, comprising:
   transmitting infrared radiation from a coherent source laser to an infrared magnifier;
   the infrared magnifier magnifying the infrared radiation and transmitting the radiation to a sample to be imaged;
   a magnifying and focusing device magnifying and focusing the magnified radiation and transmitting the magnified and focused radiation, wherein the infrared radiation is reflected from or transmitted through the sample;
   transmitting the reflected or transmitted radiation to a focusing device;
   focusing the radiation;
   transmitting the focused radiation to a detector to produce a data output corresponding to the sample to be imaged, wherein the infrared detecting device is a microbolometer array detector comprising a plurality of detector elements; and a processor assessing the sample imaged based on the received data, wherein the infrared radiation has sufficient power density to illuminate the sample for detection by each detector element in the microbolometer array detector.

21. The method of claim 20, wherein the specific detectivity of the microbolometer array detector is about $2 \times 10^8$ cm $Hz^{1/2}$/W.

22. The method of claim 20, further comprising: the detector producing the data output corresponding to the sample to be imaged at room temperature.

* * * * *